United States Patent [19]

Havel

[11] 4,086,514
[45] Apr. 25, 1978

[54] VARIABLE COLOR DISPLAY DEVICE

[76] Inventor: Karel Havel, P.O. Box 66, Station M, Toronto, Ontario, Canada, M6S 4T2

[21] Appl. No.: 725,789

[22] Filed: Sep. 23, 1976

Related U.S. Application Data

[60] Continuation-in-part of Ser. No. 613,265, Sep. 15, 1975, abandoned, which is a division of Ser. No. 424,069, Dec. 12, 1973, abandoned.

[51] Int. Cl.$^2$ .......................... G08B 5/36; H01L 33/00
[52] U.S. Cl. ..................................... 313/500; 313/510; 340/324 M; 358/59
[58] Field of Search ............ 315/312, 169 R, 169 TU; 313/499, 500, 505, 510; 240/3.1; 358/59; 340/324 R, 324 M, 336; 40/130 R, 130 E, 130 L, 130 M, 130 N; 350/313, 317

[56] References Cited

U.S. PATENT DOCUMENTS

| | | | |
|---|---|---|---|
| 3,238,654 | 3/1966 | Rosenak et al. | 40/130 R |
| 3,942,065 | 3/1976 | Russ | 313/500 |
| 3,947,840 | 3/1976 | Craford et al. | 357/17 X |
| 4,012,243 | 3/1977 | Keil et al. | 313/500 X |

Primary Examiner—Eugene R. LaRoche

[57] ABSTRACT

A variable color display device comprising a plurality of display areas arranged in a pattern. Each display area includes a plurality of light emitting areas for emitting light signals of respectively different colors. Each light emitting area has a plurality of branches projecting thereof and interleaved with like branches of the other light emitting areas. The light signals of different colors emitted therefrom are substantially superimposed upon one another to mix the colors without the need for an optical coupling element.

3 Claims, 3 Drawing Figures

VARIABLE COLOR DISPLAY DEVICE

CROSS-REFERENCE TO RELATED APPLICATIONS

This is a continuation-in-part of my copending application Ser. No. 613,265 filed Sept. 15, 1975, abandoned, which is a division of my application Ser. No. 424,069 filed Dec. 12, 1973, abondoned.

BACKGROUND OF THE INVENTION

1. Field of the Invention

This invention relates to semiconductor devices for emitting light of variable color.

2. Description of the Prior Art

Semiconductor display devices for unicolored display of digits and characters are well known in the art. Such display device usually includes a body of semiconductor material of one conductivity type having on its surface a plurality of diffused areas of the opposite conductivity type. The diffused areas are typically shaped in the form of bars or dots in a desired pattern. Unicolored light is emitted from p-n junctions between the areas of opposite conductivity when the diodes are forwardly biased. The color of emitted light depends on semiconductor materials and dopants used.

SUMMARY OF THE INVENTION

It is the principal object of this invention to provide a display device for displaying characters in variable color.

In summary, each display area of the display device of this invention includes three light emitting semiconductor areas for emitting light singals of respectively different colors. The first two light emitting areas, extending longitudinally in parallel relation, have a plurality of inwardly directed interleaved branches. The thrid light emitting area is sinuously interposed between the interleaved branches of the first two light emitting areas. The light signals of different colors emerging from the branches of the light emitting areas overlap at a very short distance from the display area where they additively mix without the need for an optical coupling element.

DESCRIPTION OF THE PREFERRED EMBODIMENTS

Figure 1:
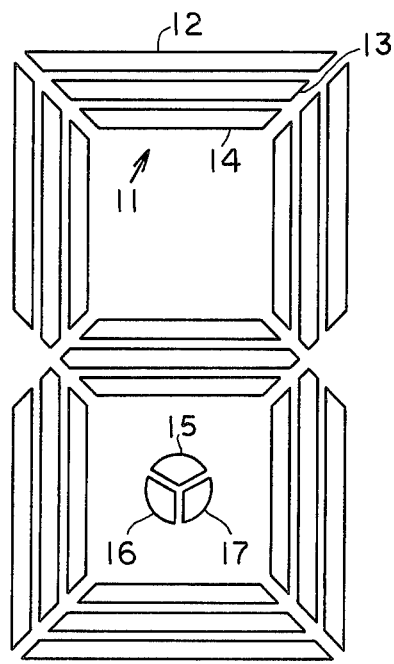
FIG. 1 is a top view of a variable color seven segment display device of this invention.

By referring to the drawings, in FIG. 1 is illustrated a seven segment display device for displaying digits in variable color. Each display segment 11 is formed by three closely adjacent semiconductor light emitting areas in the form of elongated bars 12, 13, 14 mounted on the substrate. The bars can be selectively activated to emit variable proportions of light signals of three different primary colors. Due to close proximity of the display bars, the light signals emitted from the three bars in each segment are substantially superimposed upon one another to mix the colors.

The color of the composite light signal emitted from each segment can be readily determined from well known additive mixing color triangle, when the proportions of the primary colors are known. Any color of the spectrum can be simulated by adding suitable proportions of three primary colors. The color of the composite light signal can be varied by variably forwardly biasing the three light emitting areas by an analog or digital technique.

The decimal point of the illustrated display device also includes three closely adjacent light emitting circular sectors 15, 16, 17 which can be selectively energized to emit variable proportions of light signals of respectively different colors. Due to close proximity of the sectors, a visual impression will be produced as though the three colors were exactly superimposed upon one another, creating thus an impression of the composite color.

Figure 2:
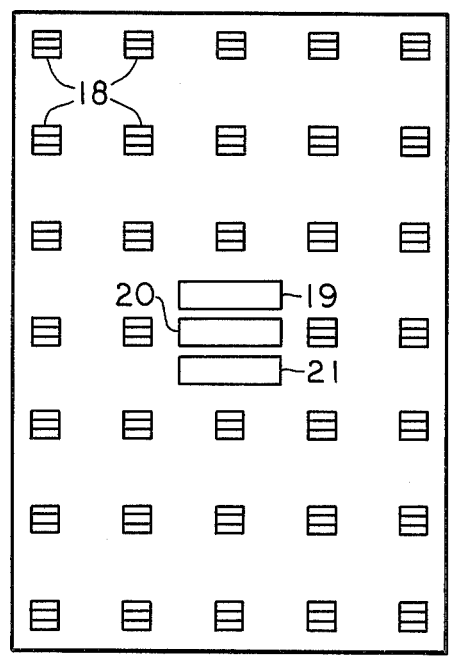
FIG. 2 is a top view of a variable color alphanumeric 5×7 dot matrix display device.

In FIG. 2 is shown a 5×7 dot matrix display device for emitting light signals of variable color. The display dots are mounted on a common support and arranged in rows and columns. Each dot 18 includes three light emitting diodes 19, 20, 21 positioned closely adjacent to one another in side by side relation, as shown on detailed view of the display dot in the centre of the display device. The light emitting diodes 19, 20, 21 emit light signals of respectively different primary colors when forwardly biased. Typically, the primary colors are red, green, and blue.

Due to close proximity of the light emitting diodes in each display dot, the light signals emitted therefrom are substantially superimposed upon one another to mix the colors without the need for an optical coupling element. The color of the composite light signal can be varied by varying proportions of the light signals of three primary colors. The color of the display dots can be varied uniformly or individually, either directly or by a technique of scanning or strobing.

The light emitting areas in the display devices illustrated in FIG. 1 and 2 can be connected to electrical terminals of a housing, either directly or by a technique of multiplexing, for receiving electric signals.

Figure 3:
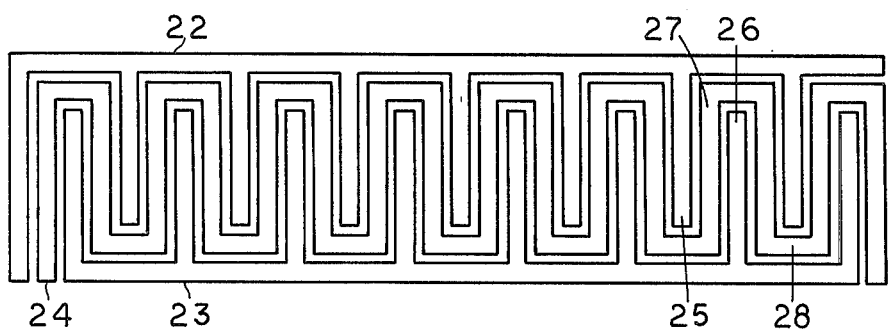
FIG. 3 is an enlarged detail of one display area of another embodiment of a variable color display device.

In FIG. 3 is shown an enlarged detail of one display segment of a variable color seven segment display device. The illustrated display segment consists of two light emitting areas 22, 23 extending longitudinally in parallel relation. The first light emitting area 22 has a plurality of inwardly directed branches 25 extending transversely to the direction of elongation and interleaved with like branches 26 of the second light emitting area 23. The third light emitting area 24 is sinuously interposed between the interleaved branches 25, 26.

The light emitting areas 22, 23, 24 emit light signals of respectively different colors when energized. Because of the close proximity of the branches of the light emitting areas, the light signals of different colors emerging therefrom overlap at a very short distance from the display segment where they additively intermix to form light of a composite color.

The branches 25, 26 of respective light emitting areas 22, 23 are mutually parallel with the branches 27 of the light emitting area 24 and separated from one another by uniform distances less than the width of the branches. The branches are arranged in a systematic order such that the colors of the light signals emitted from adjacent branches alternate, to obtain a coherent output composite light without the need for an optical coupling element.

Variable color display device of this invention may be fabricated on a single semiconductor crystal. Display areas for emitting light signals of different colors may be obtained by using different dopants.

It will be obvious to those having ordinary skill in the art that modifications and variations may be made in the detailed structure of display areas of this invention and that the display areas may have other shapes than illustrated.

What I claim is:

1. A variable color display device comprising a plurality of display areas, each said display area including three light emitting areas for emitting light signals of respectively different colors, each said light emitting area having a plurality of branches interleaved with like branches of the other light emitting areas to cause the light signals of different colors emitted therefrom to be substantially superimposed upon one another to mix said colors without the need for an optical coupling element.

2. A variable color display device comprising a plurality of display areas, each said display area including two light emitting areas for emitting light signals of two different colors, respectively, said two light emitting areas extending longitudinally in a parallel relation, each said light emitting area having a plurality of inwardly directed branches interleaved with like branches of the other light emitting area, and a third light emitting area for emitting light signals of a third color, said third color being different from said two colors, said third light emitting area being sinuously interposed between the interleaved branches of said first and second light emitting areas such that the light signals of three different colors emitted from said display area are substantially superimposed upon one another to mix said colors without the need for an optical coupling element.

3. A variable color display device of claim 2 wherein said branches extend transversely to the direction of elongation of said display area, said branches being of uniform width and mutually parallel, separated from one another by uniform distances less than the width of the branches, said branches being further arranged in a systematic order such that the colors of the light signals emitted from adjacent branches alternate, to obtain a coherent output composit light.

* * * * *